United States Patent
Derner et al.

(10) Patent No.: US 11,211,113 B1
(45) Date of Patent: Dec. 28, 2021

(54) INTEGRATED ASSEMBLIES COMPRISING WORDLINES HAVING ENDS SELECTIVELY SHUNTED TO LOW VOLTAGE FOR SPEED TRANSITIONING

(71) Applicant: Micron Technology, Inc., Boise, ID (US)

(72) Inventors: Scott J. Derner, Boise, ID (US); Christopher J. Kawamura, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/996,741

(22) Filed: Aug. 18, 2020

(51) Int. Cl.
| | | |
|---|---|---|
| *G11C 11/4091* | (2006.01) | |
| *G11C 11/408* | (2006.01) | |
| *G11C 11/4096* | (2006.01) | |
| *G11C 11/4099* | (2006.01) | |
| *G11C 11/4076* | (2006.01) | |
| *G11C 11/4074* | (2006.01) | |

(52) U.S. Cl.
CPC ...... *G11C 11/4085* (2013.01); *G11C 11/4074* (2013.01); *G11C 11/4076* (2013.01); *G11C 11/4096* (2013.01); *G11C 11/4099* (2013.01)

(58) Field of Classification Search
CPC ............ G11C 11/4085; G11C 11/4096; G11C 11/4076; G11C 11/4074; G11C 11/4099
See application file for complete search history.

(56) References Cited

U.S. PATENT DOCUMENTS

| | | | |
|---|---|---|---|
| 6,034,913 A * | 3/2000 | Freimuth | G11C 8/08 365/230.06 |
| 6,337,824 B1 * | 1/2002 | Kono | G11C 11/4091 365/207 |
| 11,074,964 B1 | 7/2021 | Kawamura et al. | |
| 2018/0218765 A1 * | 8/2018 | Derner | H01L 27/10805 |
| 2019/0206736 A1 * | 7/2019 | Sills | H01L 23/5226 |
| 2019/0393224 A1 * | 12/2019 | Wang | H01L 27/10855 |
| 2020/0051613 A1 * | 2/2020 | Derner | G11C 5/025 |
| 2021/0066272 A1 * | 3/2021 | Fujisawa | H01L 25/18 |

* cited by examiner

*Primary Examiner* — Mushfique Siddique
(74) *Attorney, Agent, or Firm* — Wells St. John P.S.

(57) ABSTRACT

Some embodiments include an integrated assembly having first and second wordlines coupled with DRIVER circuitry. The first wordline has a first end distal from the DRIVER circuitry, and the second wordline has a second end distal from the DRIVER circuitry. A switch is adjacent to the first end and is configured to couple said first end to one or both of the second end and a LOW-VOLTAGE-REFERENCE-SOURCE (e.g., a VNWL supply) during a transition of the first wordline from an "ON" state to an "OFF" state.

26 Claims, 11 Drawing Sheets

INTEGRATED ASSEMBLIES COMPRISING WORDLINES HAVING ENDS SELECTIVELY SHUNTED TO LOW VOLTAGE FOR SPEED TRANSITIONING

TECHNICAL FIELD

Memory arrays (e.g., DRAM arrays). Integrated assemblies comprising vertically-stacked decks.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

Figure 1:
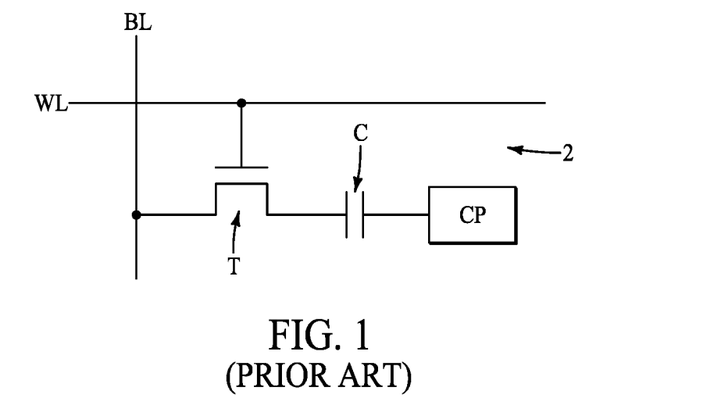
FIG. 1 is a schematic diagram of a prior art memory cell having one transistor and one capacitor.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit line, sense line, second linear structure, etc.). In operation, an electrical field generated by voltage along the wordline may gatedly couple the bitline to the capacitor during read/write operations.

Figure 2:
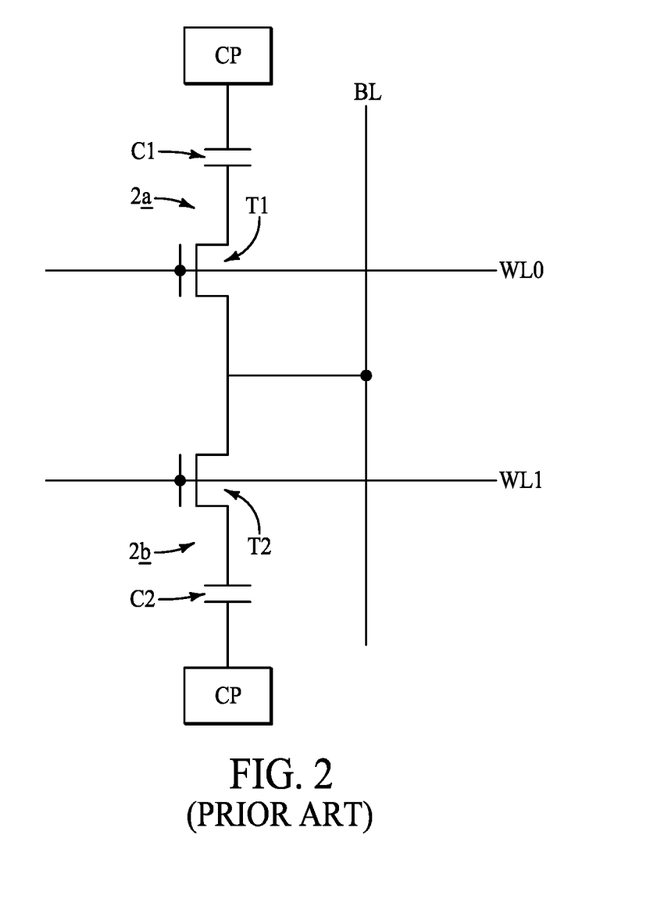
FIG. 2 is a schematic diagram of a pair of prior art memory cells which each have one transistor and one capacitor, and which share a bitline connection.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

Figure 3:
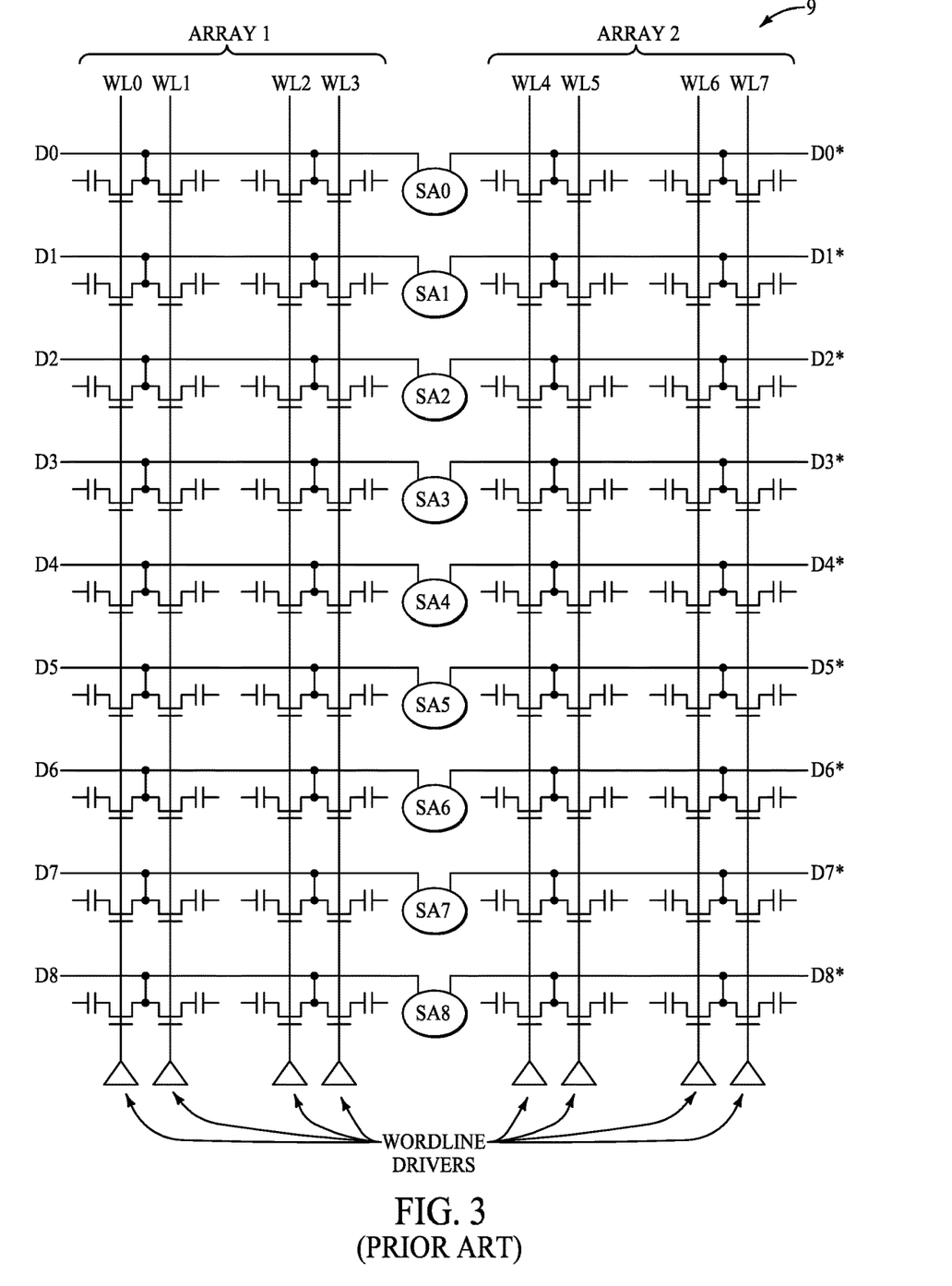
FIG. 3 is a schematic diagram of a prior art integrated assembly having open bitline architecture.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 to simplify the drawing). Wordlines WL0-WL7 extend across the arrays, and are coupled with wordline drivers. Digit lines D0-D8 are associated with the first array (ARRAY-1), and digit lines D0*-D8* are associated with the second array (ARRAY-2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

A continuing goal of integrated circuit fabrication is to increase packing density and to thereby increase the level of integration. It would be desirable to develop three-dimensional arrangements having tightly packed memory. Another continuing goal is to rapidly read/write from/to memory cells of a memory array. A limitation on the speed of a READ/WRITE operation may be the speed at which wordlines can be transitioned from "On" to "Off".

DETAILED DESCRIPTION OF THE ILLUSTRATED EMBODIMENTS

Some embodiments include integrated assemblies comprising wordlines having ends selectively shunted to low voltage. Such configuration may speed transitioning from an "ON" mode to an "OFF" mode. Example embodiments are described with reference to FIGS. 4-10.

Figure 4:
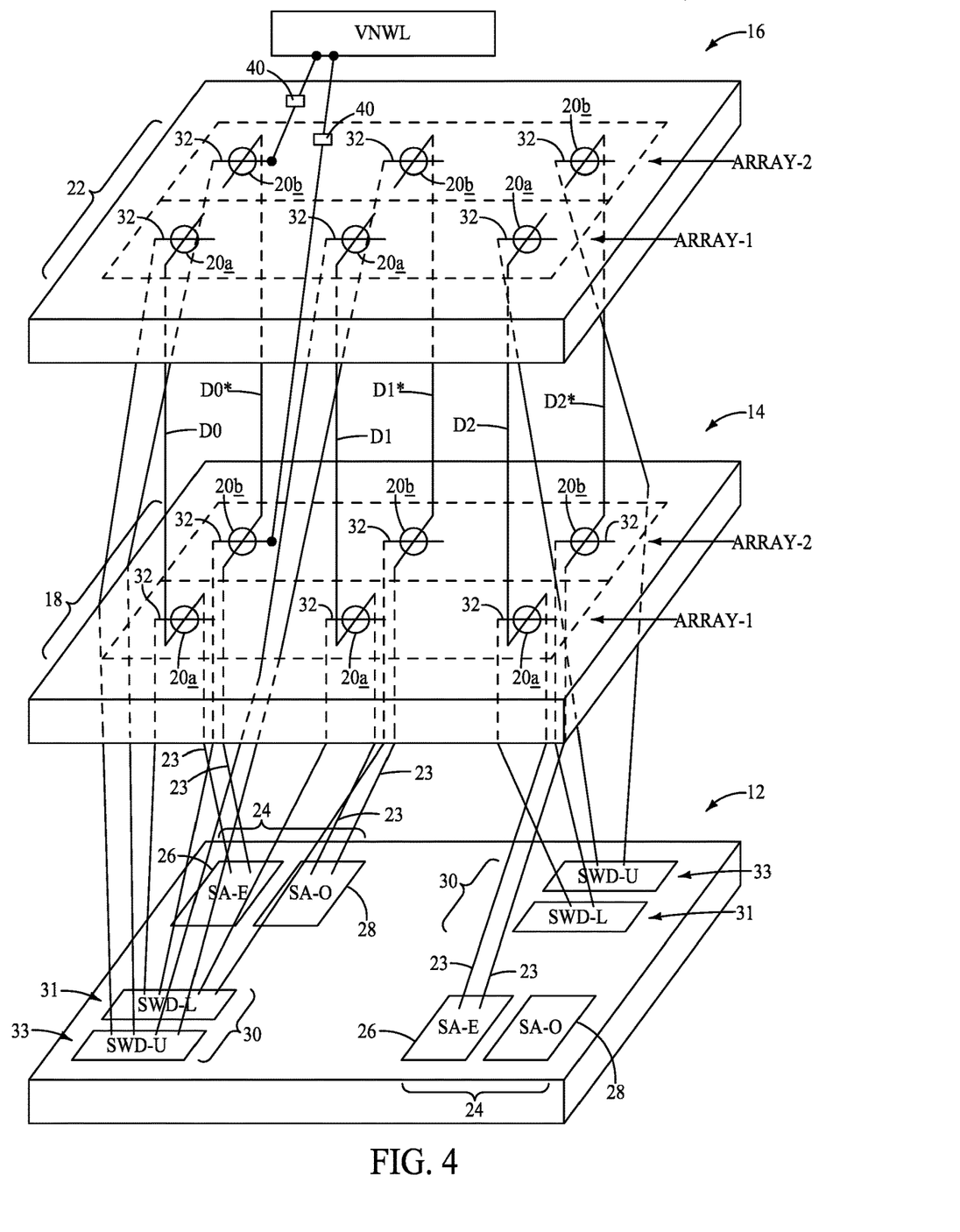
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels that are stacked one atop the other. The levels may be within different semiconductor dies, or at least two of the levels may be within the same semiconductor die.

The first and second decks 14 and 16 have memory regions 18 and 22, respectively. First and second memory arrays (ARRAY-1 and ARRAY-2 analogous to those of FIG. 3) are supported by the first and second decks 14 and 16, with each of the memory arrays having a first portion along the first (lower) deck 14 and a second portion along the second (upper) deck 16. The first memory array includes first memory cells 20a, and the second memory array includes second memory cells 20b. The memory cells are diagrammatically illustrated as circles. The first and second memory arrays may comprise any suitable number of memory cells, and in some embodiments may comprise hundreds, thousands, millions, etc., of memory cells. The memory cells may be DRAM cells, and in some embodiments may be configured in arrangements of the types described above with reference to prior art FIGS. 1-3 (i.e., ARRAY-1 and ARRAY-2 may be DRAM arrays).

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises SENSE AMPLIFIER circuitry (SA) and WORDLINE DRIVER circuitry (WD).

The SENSE AMPLIFIER circuitry includes regions labeled "SA-E" to identify them as being associated with an "even" portion of a circuit, and regions labeled "SA-0" to identify them as being associated with an "odd" portion of a circuit. The terms "even" and "odd" are arbitrary, and are utilized to distinguish the different SENSE AMPLIFIER circuitries from one another. The illustrated configuration has the SENSE AMPLIFIER circuitries SA-O and SA-E paired with one another and distributed as structures (blocks) 24.

The WORDLINE DRIVER circuitry (i.e., row-driver circuitry) includes regions 31 labeled SWD-L, and regions 33 labeled SWD-U. The acronym SWD stands for sub-wordline-driver, and is utilized to emphasize that the components SWD-L and SWD-U are portions of the general WORDLINE DRIVER circuitry. In other words, the components SWD-L and SWD-U may be considered to be SUB-DRIVERS (or SUB-DRIVER circuitries) relative to the general WORDLINE DRIVER circuitry. In the illustrated embodiment, the SUB-DRIVER circuitries SWD-L are utilized during operation of the memory cells associated with the lower deck 14, and the SUB-DRIVER circuitries SWD-U are utilized during operation of the memory cells associated with the upper deck 16.

The illustrated configuration has the SUB-DRIVER circuitries SWD-L and SWD-U paired with one another and distributed as structures (blocks) 30. In some embodiments, one of the SUB-DRIVER circuitries SWD-L and SWD-U may be referred to as a first SUB-DRIVER circuitry, and the other may be referred to as a second SUB-DRIVER circuitry.

The blocks 24 and 30 may be considered to form patch regions. The patch regions may be considered together to form a quilted arrangement of the circuit subunits along the base 12.

First digit lines D0, D1 and D2 are associated with the first memory array (ARRAY-1). The first digit lines D0, D1 and D2 extend along the first memory array (ARRAY-1) and are coupled with first memory cells 20a of the first memory array. The digit lines D0, D1 and D2 are laterally spaced from one another, and may be representative of a large number of substantially identical digit lines extending across the first memory array; with the term "substantially identical" meaning identical to within reasonable tolerances of fabrication and measurement. The first digit lines alternate between even first digit lines and odd first digit lines, with the digit lines D0 and D2 being representative of even first digit lines, and the digit line D1 being representative of an odd first digit line. The even first digit lines (e.g., D0) are coupled with the first SENSE AMPLIFIER circuitry 26 (i.e., SA-E), and the odd first digit lines (e.g., D1) are coupled with the second SENSE AMPLIFIER circuitry 28 (i.e., SA-O). The first digit lines D0, D1 and D2 have first portions along the first deck 14, and have second portions along the second deck 16.

Second digit lines D0*, D1* and D2* are associated with the second memory array (ARRAY-2). The second digit lines D0*. D1* and D2* extend along the second memory array and are coupled with second memory cells 20b of the second memory array (ARRAY-2). The digit lines D0*, D1* and D2* are laterally spaced from one another, and may be representative of a large number of substantially identical digit lines extending across the second memory array. The second digit lines alternate between even second digit lines and odd second digit lines, with the digit lines D0* and D2* being representative of even second digit lines, and the digit line D1* being representative of an odd second digit line. The even second digit lines (e.g., D0*) are coupled with the first SENSE AMPLIFIER circuitry 26 (SA-E), and the odd second digit lines (e.g., D1*) are coupled with the second SENSE AMPLIFIER circuitry 28 (SA-0). The second digit lines D0*, D1* and D2* have first portions along the first deck 14, and have second portions along the second deck 16.

The even first digit lines D0 and D2 are comparatively coupled with the even second digit lines D0* and D2* through the first SENSE AMPLIFIER circuitry 26 (SA-E); and the odd first digit line D1 is comparatively coupled with the odd second digit line D1* through the second SENSE AMPLIFIER circuitry 28 (SA-0). For purposes of understanding this disclosure and the claims that follow, a first digit line is "comparatively coupled" with a second digit line through a SENSE AMPLIFIER circuitry if the SENSE AMPLIFIER circuitry is configured to compare electrical properties (e.g., voltage) of the first and second digit lines with one another.

Two digit lines which are comparatively coupled with one another through SENSE AMPLIFIER circuitry may be considered to be complementary to one another. For instance, the digit lines D0 and D0* are complementary to one another, as are the digit lines D1 and D1*. In some embodiments, complementary digit lines may be considered to form a complementary digit line pair. Accordingly, the digit lines D0 and D0* may be considered to form a first complementary pair, and the digit lines D1 and D1* may be considered to form a second complementary pair.

In the illustrated embodiment of FIG. 4, the digit lines D0, D0*, D1, D1*, D2 and D2* are all vertically displaced relative to the first and second SENSE AMPLIFIER circuitries SA-E and SA-0. Also, the digit lines D0, D0*, D1, D1*, D2 and D2* are all laterally displaced relative to one another.

In some embodiments, the digit lines along the first memory array (ARRAY-1) may be referred to as a first set of digit lines, and the digit lines along the second memory array (ARRAY-2) may be referred to as a second set of digit lines. The digit lines are also identified with the generic label 23.

Referring still to FIG. 4, wordlines 32 extend along the first and second memory arrays (ARRAY-1 and ARRAY-2).

Each of the first memory cells 20a within the first memory array (ARRAY-1) is uniquely addressed by one of the digit lines extending along the first memory array (e.g., one of the digit lines D0, D1 and D2), and one of the wordlines 32. Similarly, each of the memory cells 20b within the second memory array (ARRAY-2) is uniquely addressed by one of the digit lines extending along the second memory array (e.g., one of the digit lines D0*, D1* and D2*), and one of the wordlines 32.

An advantage of the configuration of FIG. 4 is that all of the SENSE AMPLIFIER circuitry and all of the WORD-LINE DRIVER circuitry is provided directly under the memory arrays (ARRAY-1 and ARRAY-2), which may enable tight packing of the memory arrays across a semiconductor substrate; or in other words, which may conserve valuable semiconductor real estate as compared to configurations in which at least some of the SENSE AMPLIFIER circuitry and/or at least some of the WORDLINE DRIVER circuitry is not directly under a memory array. The vertical stacking of regions of the memory arrays (ARRAY-1 and ARRAY-2) may further conserve valuable semiconductor real estate.

Some embodiments include methods for increasing a rate (speed) for transitioning a wordline from an "ON" state to an "OFF" state. The wordlines may be considered to include first ends which are proximal to the SUB-DRIVER circuitries, and second ends which are distal from the first ends. Example embodiments described herein may include coupling the second end of a wordline to one or more low-voltage sources (supplies) during the switching of the wordline from the "ON" state to the "OFF" state, which may substantially improve the speed at which the wordline is switched as compared to conventional methods in which the ends of the wordlines are electrically floating. The low-voltage source(s) may include, for example, a LOW-VOLTAGE-REFERENCE-SOURCE (e.g., a source at a negative wordline voltage, VNWL), a wordline which is already at the "OFF" state, etc. The example alignment of FIG. 4 shows distal ends of two of the wordlines being selectively coupled with VNWL through switches 40. Only two of the wordlines are shown to have distal ends which are selectively coupled with the VNWL in order to simplify the drawing. In practice, distal ends of all the wordlines may be coupled with VNWL (and/or with other suitable low-voltage sources).

Example assemblies having distal end of wordlines coupled with one or more suitable low-voltage sources are described with reference to FIGS. 5-10.

Figure 5A:
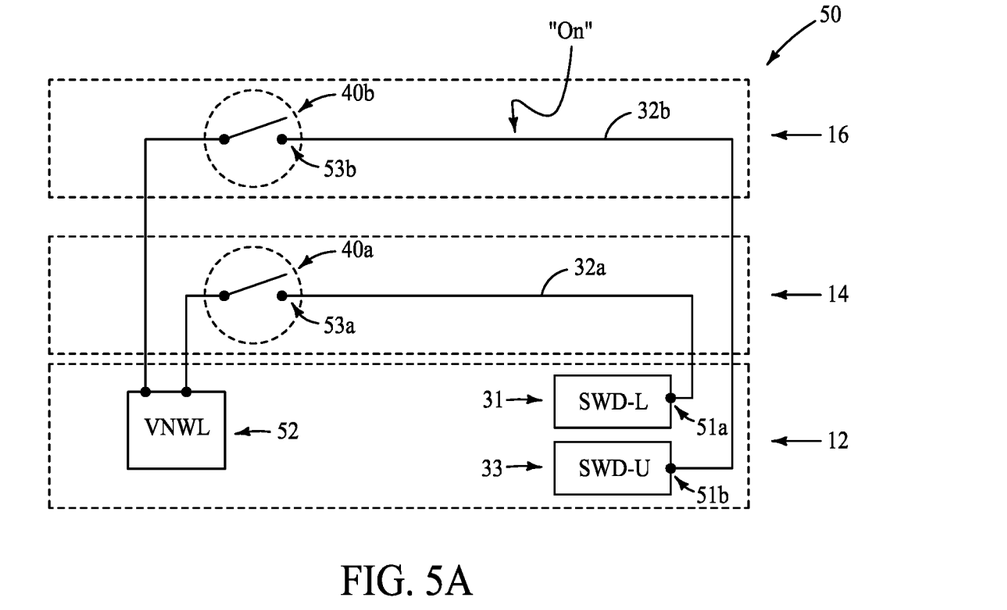
FIGS. 5A and 5B are diagrammatic operational views of an example layout comprising a pair of wordlines within an arrangement having vertically-stacked decks.
Figure 5B:
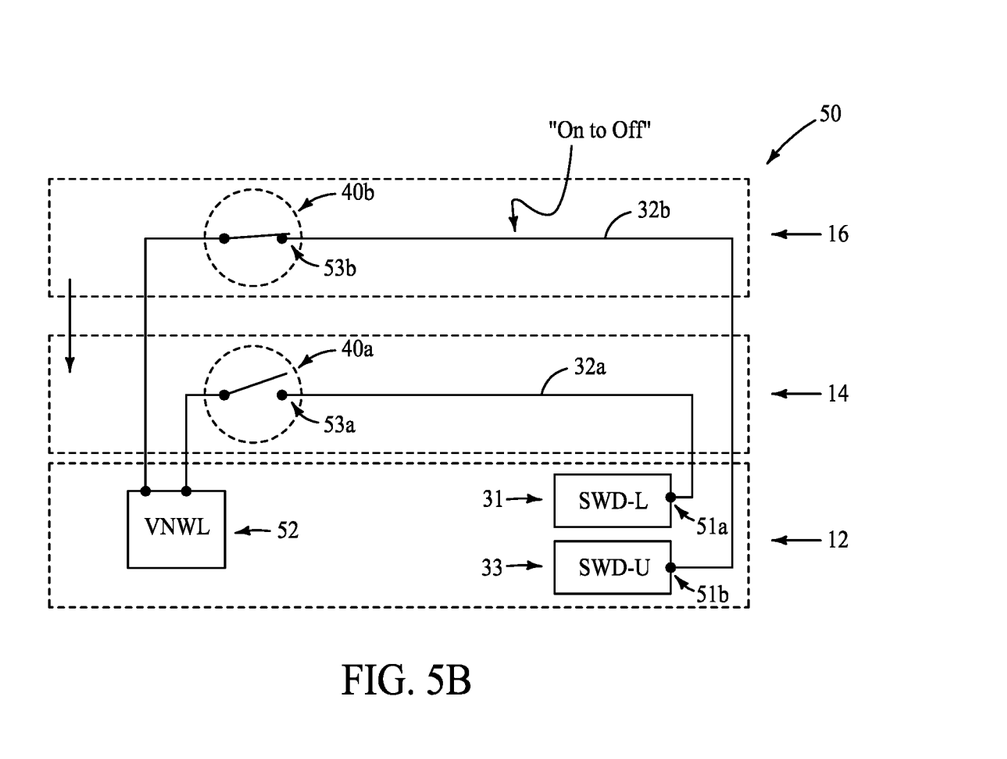

Referring to FIGS. 5A and 5B, such diagrammatically illustrate a multi-deck assembly 50. The multi-deck assembly includes a base 12, a first deck 14 and a second deck 16 analogous to those described above with reference to FIG. 4. The SUB-DRIVER circuitries SWD-L and SWD-U 31 and 33 are associated with the base 12, and a LOW-VOLTAGE-REFERENCE-SOURCE 52 is also associated with the base 12. In the illustrated embodiment, the LOW-VOLTAGE-REFERENCE-SOURCE 52 corresponds to VNWL, but in other embodiments it may correspond to another suitable voltage level (supply). In some embodiments, the wordlines of a memory array may have an ON voltage which is above a threshold voltage of access devices (e.g., transistors) adjacent the wordlines, and may have an OFF voltage which is below the threshold voltage of the access devices. The LOW-VOLTAGE-REFERENCE-SOURCE may be at a voltage level which is less than or equal to the OFF voltage of the wordlines. For instance, VNWL may be less than or equal to about −0.3 volts (V).

The assemblies 50 include a pair of wordlines 32, with the wordlines being labeled 32a and 32b so that they may be distinguished relative to one another. The wordline 32a has a proximal end 51a coupled with the SUB-DRIVER circuitry SWD-L, and has a distal end 53a adjacent to a switch 40a. The wordline 32b has a proximal end 51b coupled with the SUB-DRIVER circuitry SWD-U, and has a distal end 53b adjacent to a switch 40b. The wordlines 32a and 32b extend along the first and second decks 14 and 16, respectively. In some embodiments, one of the wordlines 32a and 32b may be referred to as a first wordline, and the other may be referred to as a second wordline. In some embodiments, the wordline 32a may be referred to as a lower wordline, and the wordline 32b may be referred to as an upper wordline.

FIG. 5A shows an operational stage in which the upper wordline 32b is in an ON operational state (mode), and FIG. 5B shows an operational stage in which the upper wordline 32b is transitioned from the ON operational state (mode) to an OFF operational state (mode). The switch 40b is OPEN at the operational stage of FIG. 5A so that the wordline 32b functions normally for accessing memory cells. However, the switch 40b is CLOSED at the operational stage of FIG. 5B so that the LOW-VOLTAGE-REFERENCE-SOURCE 52 is coupled to the distal end 53b of the wordline 32b. Such coupling of the wordline to the LOW-VOLTAGE-REFERENCE-SOURCE 52 may substantially increase a rate of transitioning of the wordline 32b from the ON mode to the OFF mode as compared to conventional configurations lacking the connection of the distal end to the LOW-VOLTAGE-REFERENCE-SOURCE 52.

The switch 40a associated with the lower wordline 32a may be operated similarly to the switch 40b associated with the upper wordline 32b, and specifically may be operated to couple the distal end 53a of the wordline 32a to the LOW-VOLTAGE-REFERENCE-SOURCE 52 during the transitioning of the wordline 32a from an ON mode to an OFF mode.

Figure 6:
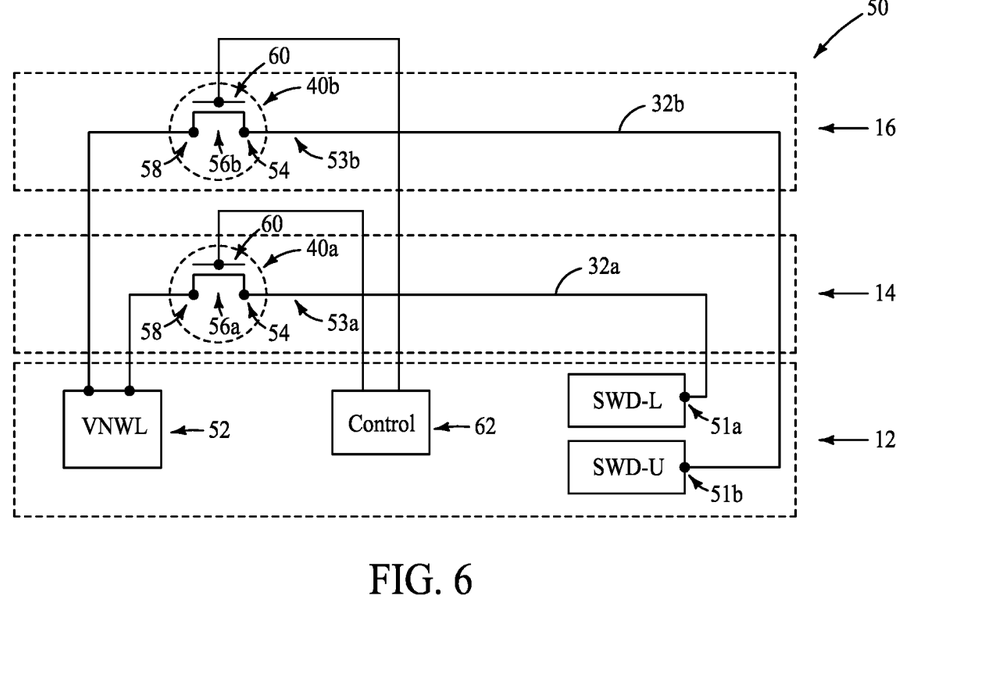
FIG. 6 is a diagrammatic side view of an example layout comprising pair of wordlines within an arrangement having vertically-stacked decks.

The switches 40a and 40b may have any suitable configurations. In some embodiments, such switches may correspond to transistors. FIG. 6 shows the assembly 50 of FIGS. 5A and 5B in a configuration in which the switches 40a and 40b correspond to transistors 56a and 56b, respectively.

Each of the transistors 56 has a first source/drain region 54 coupled to a distal end 53 of an associated wordline, and has a second source/drain region 58 coupled with the LOW-VOLTAGE-REFERENCE-SOURCE 52. The transistors 56 also include gates 60 configured to selectively couple the source/drain regions 54 and 58 to one another. The gates 60 are coupled to CONTROL circuitry 62. The CONTROL circuitry may be configured to selectively either turn a selected transistor ON and thereby couple the distal end 53 of one of the wordlines 32 to the LOW-VOLTAGE-REFERENCE-SOURCE 52, or to turn the selected transistor OFF and to thereby decouple the distal end from the LOW-VOLTAGE-REFERENCE-SOURCE 52.

Figure 7:
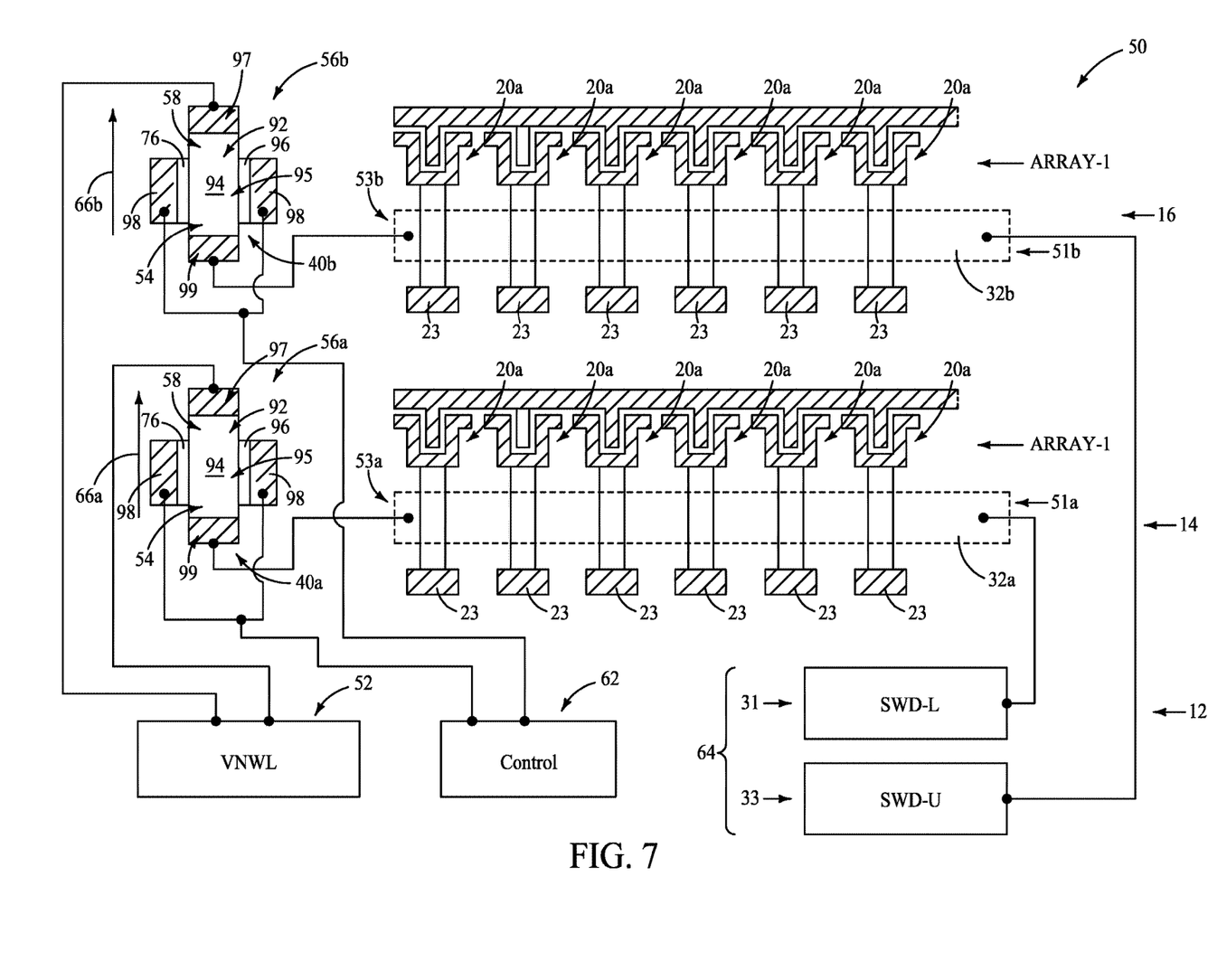
FIG. 7 is a diagrammatic side view of an example multi-deck-assembly showing an example arrangement of example circuit components. The example circuit components include memory cells.

FIG. 7 provides a more detailed view of an example arrangement of the wordlines 32a and 32b, and the CONTROL TRANSISTORS 56a and 56b within the assembly 50. Example memory cells 20a of ARRAY-1 are shown along elevational levels corresponding to the decks 14 and 16. Each of the memory cells 20a is uniquely addressed by a digit line (23) and a wordline (32a or 32b). The wordlines are shown in dashed-line (phantom) view to indicate that they are out of the plane of the cross-section of FIG. 7.

The decks 14 and 16 may each comprise portions of the first memory-cell array (Array-1) and the second memory-cell array (Array-2), as described above with reference to FIG. 4. FIG. 7 only shows portions of the first memory-cell array (Array-1) to simplify the figure, but it is to be understood that the second memory-cell array (Array-2) may be modified similarly to the modification described in FIG. 7; and, for that matter, may also be modified similarly to modifications described below with reference to FIGS. 8-10.

The illustrated embodiment includes the SUB-DRIVER circuitries 31 and 33 (SWD-L and SWD-U), the LOW-VOLTAGE-REFERENCE-SOURCE 52 (VNWL), and the CONTROL circuitry 62. The circuitries 31, 33, 52 and 62 may be supported by the base 12, and may be under the first and second decks 14 and 16.

Figure 7A:
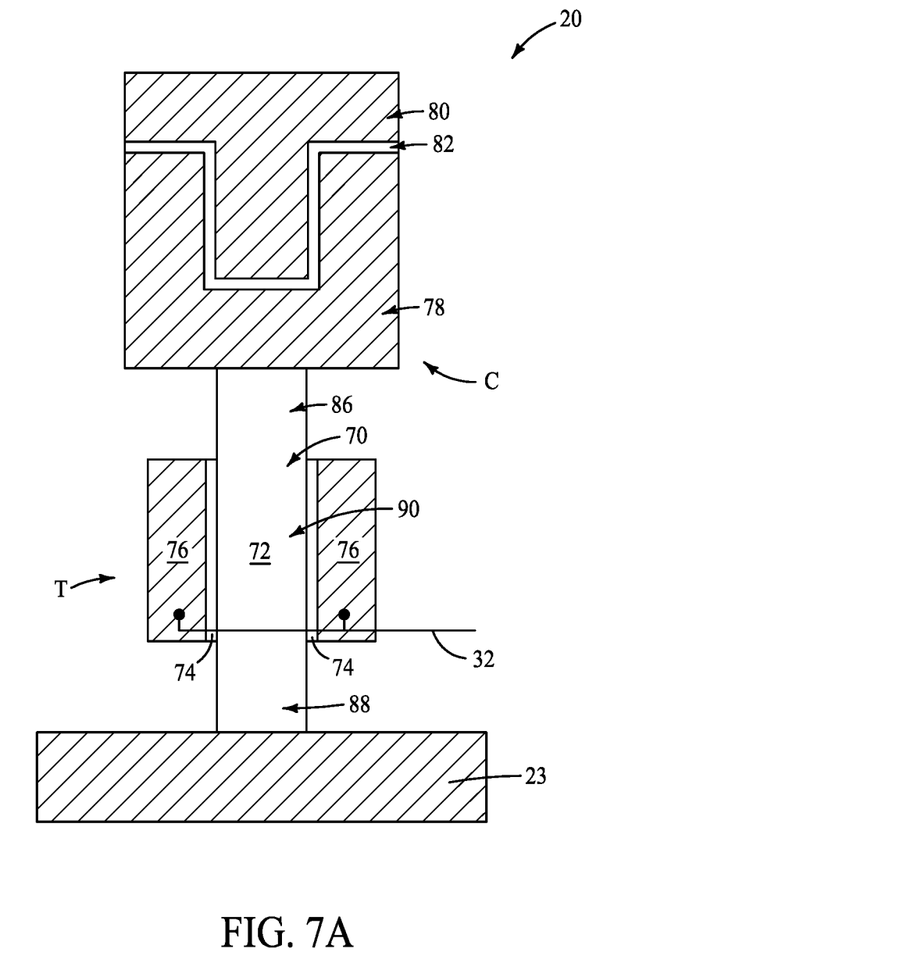
FIG. 7A is a diagrammatic side view of one of the example memory cells of FIG. 7.

An example memory cell 20 is shown in enlarged view in FIG. 7A to simplify the labeling of the components of the memory cell. The memory cell 20 includes a transistor T coupled with a capacitor C. The transistor T comprises a vertically-extending pillar 70 of semiconductor material 72. The semiconductor material 72 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

Gate dielectric material (insulative material) 74 is adjacent sidewalls of the pillar 70, and conductive gate material 76 is adjacent the gate dielectric material.

The gate dielectric material 74 may comprise any suitable composition(s); and in some embodiments may comprise, consist essentially of, or consist of silicon dioxide.

The conductive gate material 76 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gate material 76 forms the transistor gate of the transistor T. The transistor includes a first source/drain region 86 within an upper region of the pillar 70, a second source/drain region 88 within a lower region of the pillar 70, and a channel region 90 between the first and second source/drain regions 86 and 88. In operation, an electrical field generated by voltage within the gate material 76 (i.e., a voltage along a wordline 32 illustrated in FIG. 7A) may gatedly couple the source/drain regions 86 and 88 to one another through the channel region 90. When the term "gated coupling" is utilized herein, such may refer to the controlled coupling/decoupling of the source/drain regions of a transistor that may be induced by electrical activation/deactivation of the gate of the transistor.

The capacitor C comprises a first conductive node 78, a second conductive node 80, and an insulative material (capacitor dielectric material) 82 between the first and second conductive nodes.

The first and second conductive nodes 78 and 80 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 82 may comprise any suitable composition(s), and in some embodiments may comprise, consist essentially of, or consist of silicon dioxide.

In the shown embodiment, the lower conductive node 78 is configured as an upwardly-opening container. In other embodiments, the lower conductive node may have another suitable shape.

The lower conductive node 78 may be referred to as a storage node, and the upper conductive node 80 may be referred to as a plate electrode. In some embodiments, the plate electrodes may all be coupled to one another, as shown in FIG. 7.

The capacitor C is an example storage element coupled with the transistor T. In other embodiments, other suitable storage elements may be utilized in place of the capacitor C. Suitable storage-elements may be devices having at least two detectable states; and in some embodiments a suitable storage element may be, for example, a resistive-memory device, a conductive-bridging device, a phase-change-memory (PCM) device, a programmable metallization cell (PMC), etc.

Referring to FIG. 7, one of the wordlines 32a and 32b may be referred to as a first wordline, and the other may be referred to as a second wordline. The wordlines 32a and 32b have ends 51a and 51b proximate DRIVER circuitry 64, with such DRIVER being shown to include the first SUB-DRIVER circuitry 31 and the second SUB-DRIVER circuitry 33.

In some embodiments, one of the wordlines 32a and 32b may be considered to have a first end distal from the DRIVER circuitry 64, and the other of the wordlines may be considered to have a second end distal from the DRIVER circuitry 64. For instance, in some embodiments the end 53a may be referred to as a first distal end, and the end 53b may be referred to as a second distal end.

In some embodiments, the ends 51a, 51b, 53a and 53b may be referred to as first, second, third and fourth ends to distinguish them from one another. For instance, the ends 51a and 53a may be referred to as first and second ends, and the ends 51b and 53b may be referred to as third and fourth ends.

The transistors 56a and 56b are example switches 40a and 40b which are adjacent to the distal ends 53a and 53b, and which are configured to selectively couple such distal ends to the LOW-VOLTAGE-REFERENCE-SOURCE 52 during the transition of an associated wordline from an ON state to and OFF state.

The illustrated transistors 56a and 56b are analogous to the transistor T described above with reference to FIG. 7A. Specifically, the transistors have vertically-extending pillars 92 of semiconductor material 94. The semiconductor-material-pillars 92 may each comprise upper and lower source/drain regions 58 and 54, and a channel region 95 vertically between the source/drain regions 58 and 54. The transistors 56a and 56b have gate dielectric material 96 adjacent the channel regions 95, and have conductive gate material 98 adjacent the gate dielectric material 96. The conductive gate material 98 is coupled to the CONTROL circuitry 62. An electrical field generated within the gate material 98 (i.e., within a transistor gate) by the CONTROL circuitry 62 may gatedly couple the source/drain regions 54 and 58 to one another through the channel region 95.

In some embodiments, one of the transistors 56a and 56b may be referred to as a first transistor (or, more generically, as a first switch), and the other may be referred to as a second transistor (or, more generically, as a second switch). The transistors 56 may be configured identically to the transistor T of FIG. 7A (i.e., the transistor associated with a memory cell 20). Accordingly, the transistors 56 may be fabricated at the same time, and utilizing the same process steps and materials, as the transistors associated with the memory cells 20a and 20b.

In the illustrated embodiment, conductive interconnects 97 and 99 are adjacent the source/drain regions 58 and 54, and electrically couple such source/drain regions with the LOW-VOLTAGE-REFERENCE-SOURCE 52 and the distal ends 53, respectively. The conductive interconnects 97 and 99 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the wordlines 32a and 32b are vertically offset relative to one another, and are vertically offset relative to the circuitries 52, 62 and 64.

In operation, the transistors 56a and 56b may be utilized to couple the distal ends 53a and 53b of the wordlines 32a and 32b to the LOW-VOLTAGE-REFERENCE-SOURCE 52 when the individual wordlines are transitioned from an ON operational state to an OFF operational state. Arrows 66a and 66b are provided to diagrammatically illustrate discharge facilitated through the transistors 56a and 56b during the transitioning of an adjacent wordline 32a or 32b from an ON operational state to an OFF operational state. The transistors 56a and 56b are configured to be operated independently of one another so that the discharge 66a may be separately controlled relative to the discharge 66b.

In some embodiments, the wordlines along each of the levels 14 and 16 may be arranged as a series of parallel wordlines extending along a first direction. For instance, FIG. 8 diagrammatically illustrates the wordlines 32 along one of the levels 14 and 16, and shows such wordlines extending along a first direction corresponding to an illustrated x-axis direction.

The transistors 56 are along the distal ends 53 of the wordlines 32, and are arranged as a series of the transistors. Each of the transistors within such series is provided to be electrically between a distal end 53 of a wordline 32 and the LOW-VOLTAGE-REFERENCE-SOURCE 52.

The transistors 56 have gates 60 coupled with the CONTROL circuitry 62. A conductive line 91 extends along the gates 60 and is utilized for electrically coupling the gates with the CONTROL circuitry 62. The conductive line 91 is shown to extend along a second direction (an illustrated y-axis direction) which is substantially orthogonal to the first direction of the wordlines 32. The term "substantially orthogonal" means orthogonal to within reasonable tolerances of fabrication and measurement. In some embodiments, the conductive line 91 may extend along a same direction as the digit lines 23 of FIG. 7 (i.e., in and out of the page relative to the cross-sectional view of FIG. 7).

Figure 8:
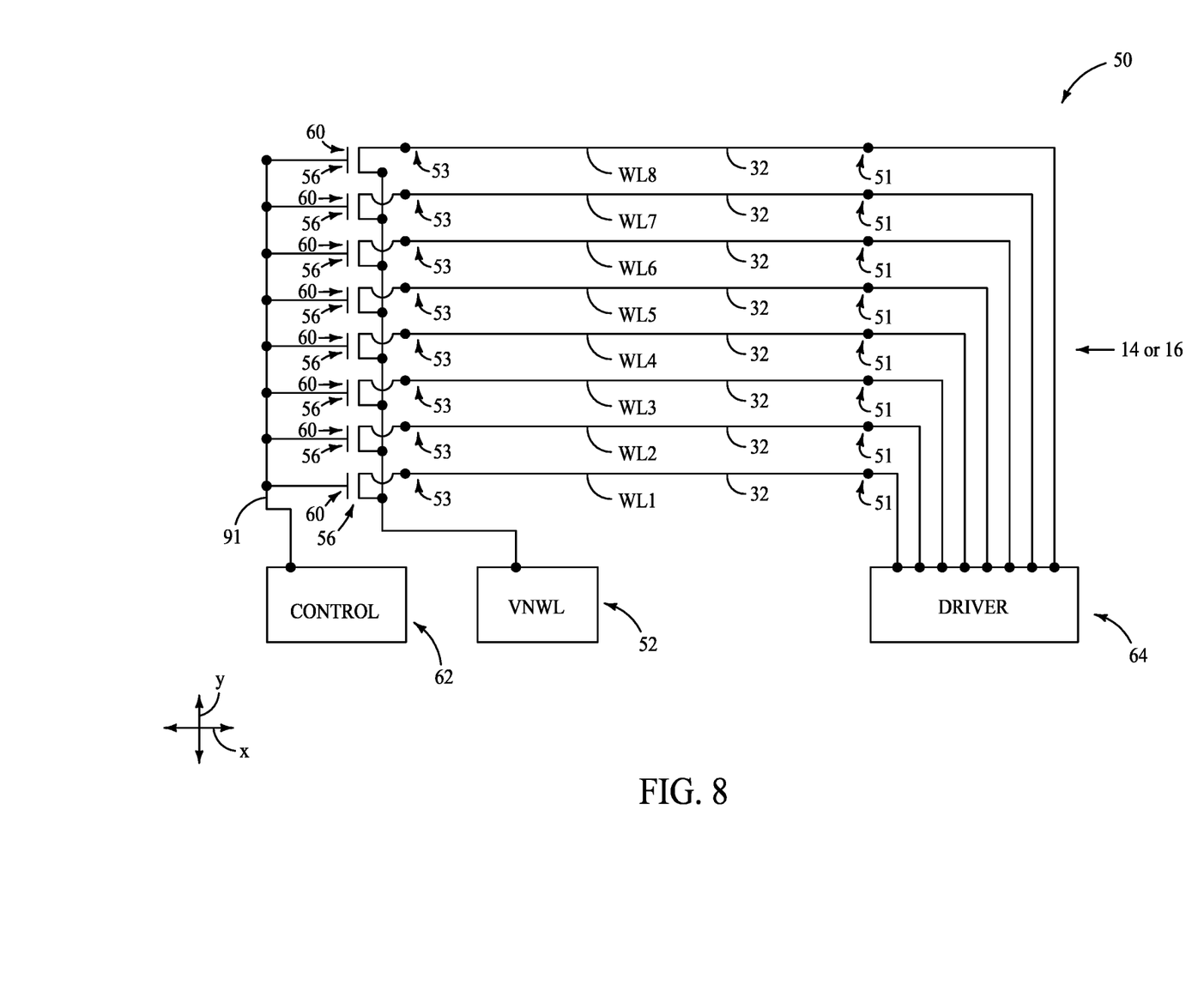
FIG. 8 is a diagrammatic view of an example layout comprising several wordlines.
Figure 8A:
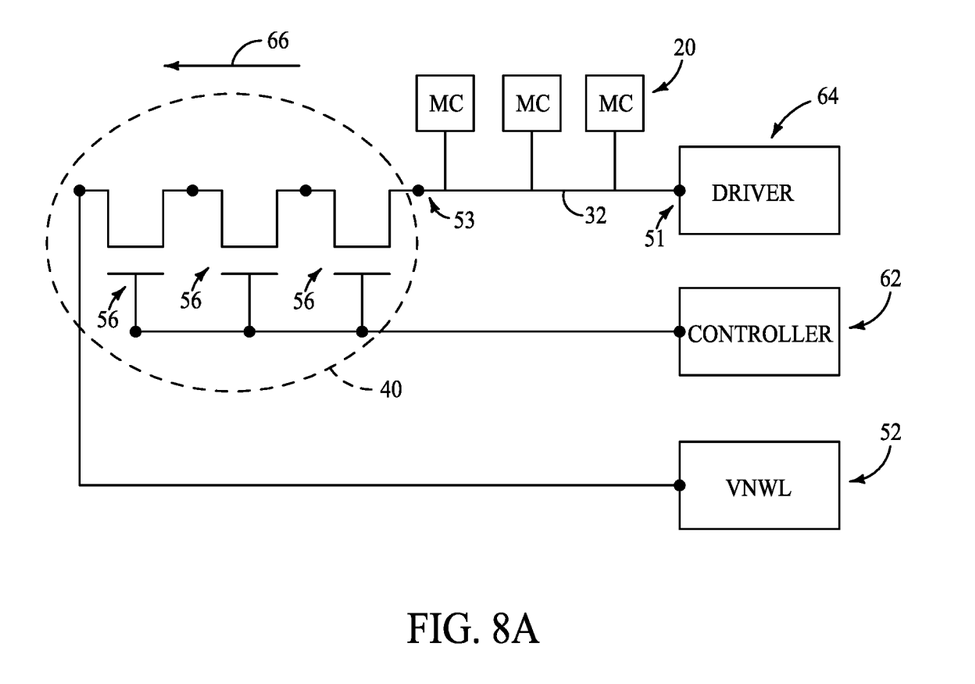
FIG. 8A is a diagrammatic view of an example layout comprising a wordline.

FIGS. 7 and 8 show the switches 40 comprising only single transistors. In other embodiments, individual switches may comprise two or more transistors. For instance, FIG. 8A shows an embodiment in which a switch 40 comprises three of the transistors 56. The embodiment of FIG. 8A shows a wordline 32 extending between a driver 64 and the switch 40, and shows memory cells (MC) 20 associated with the wordline. When the wordline is switched from an ON state to an OFF state, discharge may be facilitated through the switch 40 as indicated by the arrow 66.

Figure 9:
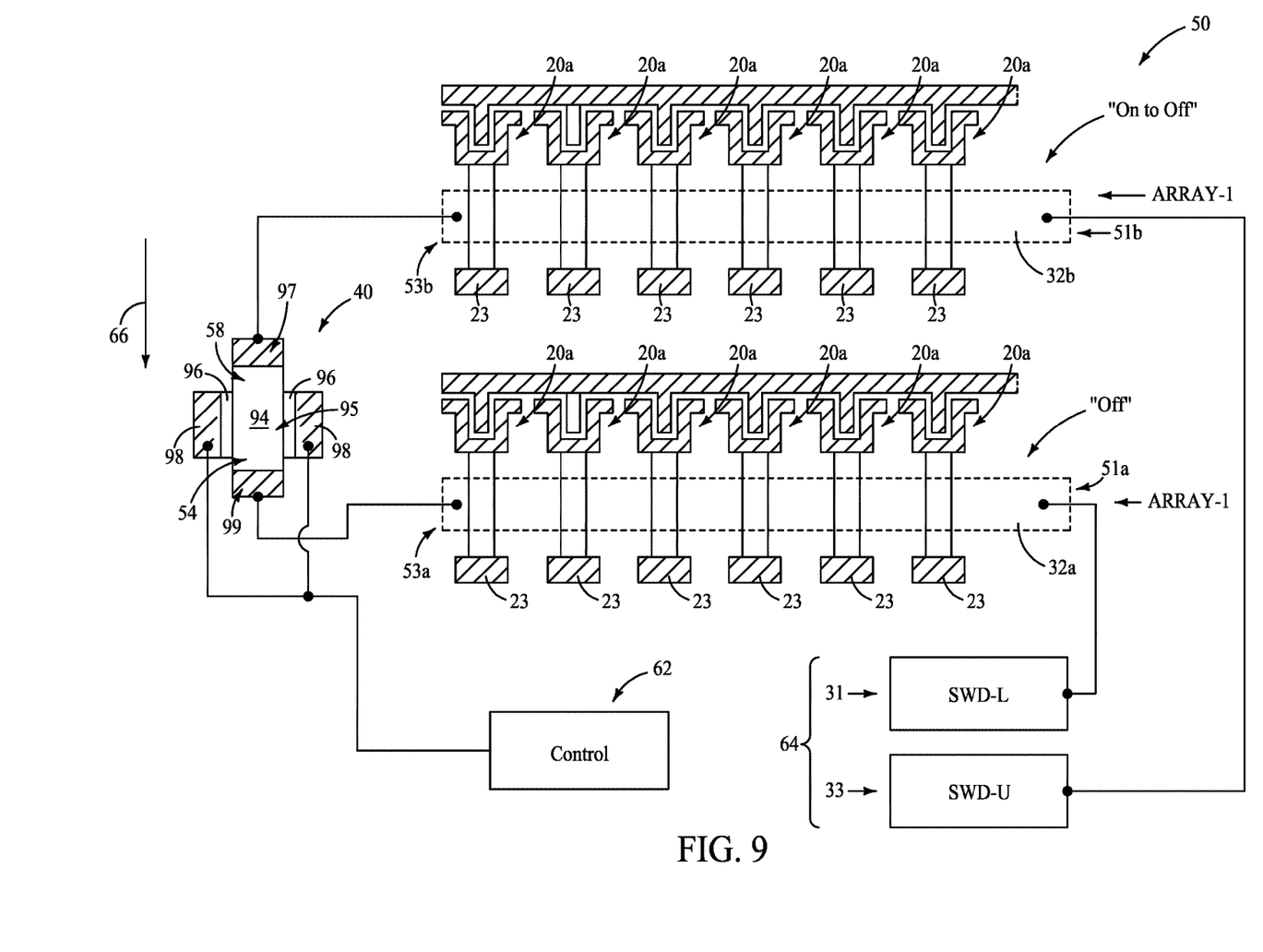
FIG. 9 is a diagrammatic side view of an example multi-deck-assembly showing an example arrangement of example circuit components.

In some embodiments, the discharge from a distal end of a wordline transitioning from an ON operational state to an OFF operational state may be directed toward a wordline which is already in an OFF operational state. FIG. 9 shows the assembly 50 configured to utilize the lower wordline 32a to facilitate discharge from the distal end 53b of the upper wordline 32b as the upper wordline is transitioned from an ON state to an OFF state. The configuration of FIG. 9 is similar to that described above with reference to FIG. 7. However, the embodiment of FIG. 9 eliminates the coupling of the distal ends 53 to the LOW-VOLTAGE-REFERENCE SOURCE, and instead couples the distal end 53b of the upper wordline 32b to the distal end 53a of the lower wordline 32a through a transistor 56 (more generically, a switch 40). The lower wordline 32a is shown to be in an OFF operational state, and the upper wordline 32b is shown to be transitioned from an ON operational state to an OFF operational state. Discharge from the distal end 53b of the upper wordline 32b, during the transition to the OFF state, is facilitated by coupling the distal end 53b to the distal end 53a through the transistor 56 (switch 40), which may substantially reduce the time required to transition the wordline 32b to the OFF state as compared to analogous devices lacking the facilitated discharge through the distal end 53b. The arrow 66 diagrammatically illustrates the facilitated discharge from the distal end 53b through the transistor 56 (switch 40) to the OFF-state lower wordline 32a.

Although the device of FIG. 9 is described as utilizing the distal end 53a of the lower wordline 32a to facilitate discharge from the distal end 53b of the upper wordline 32b, it is to be understood that the device may be operated in the opposite direction so that the distal end 53b of the upper wordline 32b is utilized to facilitate discharge from the distal end 53a of the lower wordline 32a in applications in which the upper wordline is in the OFF state and the lower wordline is transitioned from the ON state to the OFF state.

Figure 10:
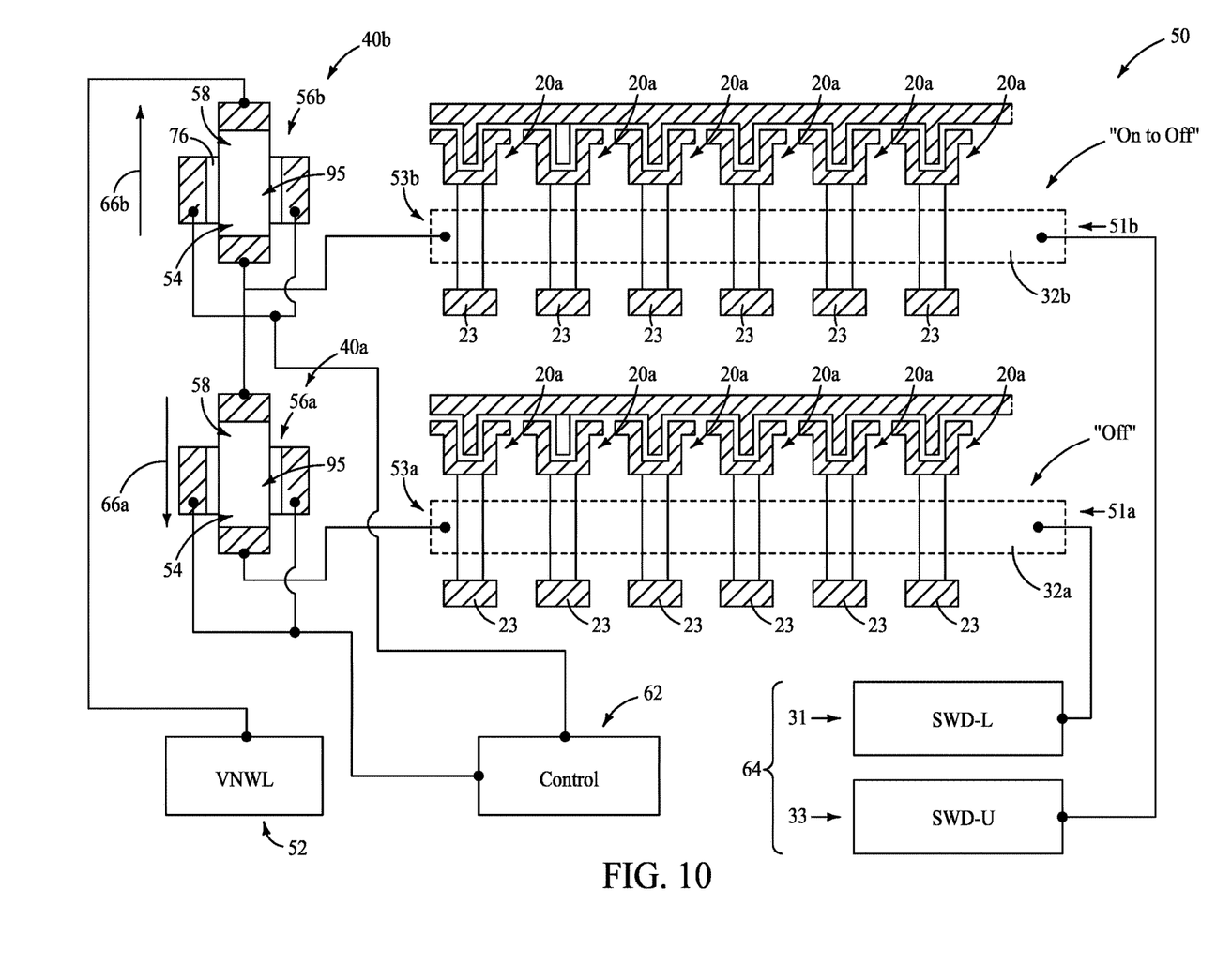
FIG. 10 is a diagrammatic side view of an example multi-deck-assembly showing an example arrangement of example circuit components.

FIG. 7 shows an application in which the LOW-VOLTAGE-REFERENCE SOURCE 52 is utilized to facilitate discharge from a distal end of a wordline during a transition of the wordline to an OFF state, and FIG. 9 shows an application which an OFF-state wordline is utilized to facilitate discharge from a distal end of an adjacent wordline during a transition of the adjacent wordline to an OFF state. In some embodiments, the applications of FIGS. 7 and 9 may be combined to facilitate the discharge from a distal end of a wordline during the transition of the wordline to the OFF state. FIG. 10 shows the assembly 50 in a configuration similar to the configurations of FIGS. 7 and 9. However, the configuration of FIG. 10 has two transistors 56a and 56b which are utilized for different purposes relative to one another.

The transistors 56a and 56b are coupled to one another through the lower source/drain region 54 of the upper transistor 56b and the upper source/drain region 58 of the lower transistor 56a. Further, the upper source/drain region 58 of the upper transistor 56b is coupled to the LOW- VOLTAGE-REFERENCE SOURCE 52, and the lower source/drain region 54 of the lower transistor 56*a* is coupled to the lower wordline 32*a*. In the illustrated embodiment, the lower wordline 32*a* is in the OFF state, and the upper wordline 32*b* is being transition from the ON state to the OFF state. The transistor 56*b* may facilitate discharge from the upper wordline 32*b* by coupling such upper wordline to the LOW-VOLTAGE-REFERENCE SOURCE 52, and the transistor 56*a* may simultaneously facilitate discharge from the upper wordline 32*b* by coupling such upper wordline to the OFF-state lower wordline 32*a*. Arrows 66*a* and 66*b* diagrammatically indicate the facilitated discharge through the transistors 56*a* and 56*b*, respectively.

Although the embodiment of FIG. 10 specifically shows the upper wordline 32*b* having discharge facilitated through the distal end 53*b*, it is to be understood that in other embodiments a configuration analogous to that of FIG. 10 may be utilized to facilitate discharge from the distal end 53*a* of the lower wordline 32*a* while the upper wordline 32*b* is in the OFF state and the lower wordline is transitioned from the ON state to the OFF state. Such other embodiments may utilize another transistor analogous to the transistor 56*b* to selectively couple the distal end 53*a* of the lower wordline 32*a* to the LOW-VOLTAGE-REFERENCE SOURCE 52.

Although the embodiments described herein indicate that there are two memory decks (14, 16) over a base 12, it is to be understood that in other embodiments there may be more than two memory decks over the base.

In some applications, the embodiments described herein may decrease the time to transition a wordline from an ON state to an OFF state by at least about 3 nanoseconds (ns), or even at least about 5 ns.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first wordline coupled with DRIVER circuitry, and a second wordline coupled with the DRIVER circuitry. The first wordline has a first end distal from the DRIVER circuitry, and the second wordline has a second end distal from the DRIVER circuitry. A switch is adjacent to the first end and is configured to couple said first end to one or both of the second end and a LOW-VOLTAGE-REFERENCE-SOURCE during a transition of the first wordline from an "ON" state to an "OFF" state.

Some embodiments include an integrated assembly comprising a first wordline coupled with first SUB-DRIVER circuitry and having a first end distal from the first SUB-DRIVER circuitry. The assembly also comprises a second wordline coupled with second SUB-DRIVER circuitry and having a second end distal from the second SUB-DRIVER circuitry. The second wordline is vertically offset relative to the first wordline. The first and second SUB-DRIVER circuitries are vertically offset relative to the first and second wordlines. A first switch is adjacent to the first end and is configured to couple said first end to a LOW-VOLTAGE-REFERENCE-SOURCE during a transition of the first wordline from an "ON" state to an "OFF" state. A second switch is adjacent to the second end and is configured to couple said second end to the LOW-VOLTAGE-REFERENCE-SOURCE during a transition of the second wordline from an "ON" state to an "OFF" state.

Some embodiments include an integrated assembly having a base comprising CONTROL circuitry, first SUB-DRIVER circuitry and second SUB-DRIVER circuitry. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. A first wordline is associated with the first array. The first wordline has a first end proximate the first SUB-DRIVER circuitry and has a second end distal from the first SUB-DRIVER circuitry and along the first deck. A second wordline is associated with the first array. The second wordline has a third end proximate the second SUB-DRIVER circuitry and has a fourth end distal from the second SUB-DRIVER circuitry and along the second deck. A transistor is adjacent one of the second and fourth ends and is configured to couple said one of the second and fourth ends to one or both of a LOW-VOLTAGE-REFERENCE-SOURCE and the other of the second and fourth ends during a transition of one of the first and second wordlines from an "ON" state to an "OFF" state. The transistor includes a vertically-extending channel region and a gate operatively proximate the channel region. The gate is coupled with the CONTROL circuitry.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first wordline coupled with DRIVER circuitry and having a first end distal from the DRIVER circuitry;
   a second wordline coupled with the DRIVER circuitry and having a second end distal from the DRIVER circuitry; and
   a switch adjacent the first end and configured to selectively couple said first end to the second end and selectively couple said first end to a LOW-VOLTAGE-REFERENCE-SOURCE during a transition of the first wordline from an "ON" state to an "OFF" state.

2. The integrated assembly of claim 1 wherein the second wordline is vertically offset from the first wordline.

3. The integrated assembly of claim 2 wherein the DRIVER circuitry includes first SUB-DRIVER circuitry and second SUB-DRIVER circuitry, and wherein the first and second wordlines are coupled with the first and second SUB-DRIVER circuitries, respectively.

4. The integrated assembly of claim 2 wherein the switch is a transistor.

5. The integrated assembly of claim 4 wherein said transistor has a vertically-extending channel region.

6. The integrated assembly of claim 1 wherein the switch is configured to couple the first end to the second end during the transition of the first wordline from an "ON" state to an "OFF" state, and while the second wordline is in the "OFF" state.

7. The integrated assembly of claim 1 wherein the switch is a first switch and is configured to couple the first end to the LOW-VOLTAGE-REFERENCE-SOURCE; and further comprising a second switch between the first end and the second end, and configured to couple the first end to the second end during the transition of the first wordline from an "ON" state to an "OFF" state, and while the second wordline is in the "OFF" state.

8. An integrated assembly, comprising:
   a first wordline coupled with first SUB-DRIVER circuitry and having a first end distal from the first SUB-DRIVER circuitry;
   a second wordline coupled with second SUB-DRIVER circuitry and having a second end distal from the second SUB-DRIVER circuitry; the second wordline being vertically offset relative to the first wordline; the first and second SUB-DRIVER circuitries being vertically offset relative to the first and second wordlines;
   a first switch transistor adjacent the first end and configured to couple said first end to a LOW-VOLTAGE-REFERENCE-SOURCE during a transition of the first wordline from an "ON" state to an "OFF" state, the first switch having a first source/drain region coupled to the first end and a second source/drain region coupled to the LOW-VOLTAGE-REFERENCE-SOURCE; and
   a second switch transistor adjacent the second end and configured to couple said second end to the LOW-VOLTAGE-REFERENCE-SOURCE during a transition of the second wordline from an "ON" state to an "OFF" state, the second switch having a third source/drain region coupled to the second end and a fourth source/drain region coupled to the LOW-VOLTAGE-REFERENCE-SOURCE.

9. The integrated assembly of claim 8 wherein the LOW-VOLTAGE-REFERENCE-SOURCE is at a negative wordline voltage (VNWL).

10. The integrated assembly of claim 8 wherein the first and second switch transistors have gates coupled with CONTROL circuitry; and wherein the CONTROL circuitry is beneath the first and second wordlines.

11. The integrated assembly of claim 8 wherein the first and second transistors comprise vertically-extending channel regions.

12. The integrated assembly of claim 8 wherein the first transistor is one of a series of transistors provided between the first end and the LOW-VOLTAGE-REFERENCE-SOURCE, said series of transistors having gates coupled with CONTROL circuitry.

13. The integrated assembly of claim 12 wherein the CONTROL circuitry is vertically offset from the first and second wordlines.

14. The integrated assembly of claim 12 wherein the CONTROL circuitry is beneath the first and second wordlines.

15. An integrated assembly, comprising:
   a base comprising CONTROL circuitry, first SUB-DRIVER circuitry and second SUB-DRIVER circuitry;
   a first deck over the base; the first deck comprising a first portion of a first array of first memory cells, and comprising a first portion of a second array of second memory cells;
   a second deck over the first deck; the second deck comprising a second portion of the first array of the first memory cells, and comprising a second portion of the second array of the second memory cells;
   a first wordline associated with the first array, the first wordline having a first end proximate the first SUB-DRIVER circuitry and having a second end distal from the first SUB-DRIVER circuitry and along the first deck;
   a second wordline associated with the first array, the second wordline having a third end proximate the second SUB-DRIVER circuitry and having a fourth end distal from the second SUB-DRIVER circuitry and along the second deck; and
   a transistor adjacent one of the second and fourth ends and configured to couple said one of the second and fourth ends to one or both of a LOW-VOLTAGE-REFERENCE-SOURCE and the other of the second and fourth ends during a transition of one of the first and second wordlines from an "ON" state to an "OFF" state; the transistor including a vertically-extending channel region between first and second source/drain regions and including a gate operatively proximate the channel region; the gate being coupled with the CONTROL circuitry, the one of the second and fourth ends adjacent the transistor being coupled with the first source/drain region.

16. The integrated assembly of claim 15 wherein the LOW-VOLTAGE-REFERENCE-SOURCE is at a negative wordline voltage (VNWL).

17. The integrated assembly of claim 15 wherein the transistor is adjacent the second end, and is configured to couple the second end to one or both of the LOW-VOLTAGE-REFERENCE-SOURCE and the fourth end during a transition of the first wordline from an "ON" state to an "OFF" state.

18. The integrated assembly of claim 17 the first wordline is one of a series of first wordlines along the first deck, wherein the transistor is one of a series of transistors, wherein each of the first wordlines of said series of the first wordlines is adjacent to one of the transistors of said series of the transistors; wherein each transistor of said series of the transistors has a gate coupled with the CONTROL circuitry, wherein a conductive line extends along the gates and is utilized for the coupling of the gates with the CONTROL circuitry; wherein the first wordlines extend along a first direction; and wherein the conductive line extends along a second direction substantially orthogonal to the first direction.

19. The integrated assembly of claim 17 wherein the transistor is a first transistor, and further comprising a second transistor adjacent the fourth end and configured to couple said fourth end to the LOW-VOLTAGE-REFERENCE-SOURCE during a transition of the second wordline from an "ON" state to an "OFF" state.

20. The integrated assembly of claim 15 wherein the memory cells include capacitors, and wherein bottom electrodes of the capacitors are configured as upwardly-opening containers.

21. The integrated assembly of claim 15 wherein the transistor is configured to couple the second end to the LOW-VOLTAGE-REFERENCE-SOURCE.

22. The integrated assembly of claim 15 wherein the transistor is configured to couple the fourth end to the LOW-VOLTAGE-REFERENCE-SOURCE.

23. The integrated assembly of claim 15 wherein the transistor is configured to couple the second end to the fourth end during the transition of the first wordline from an "ON" state to an "OFF" state, and while the second wordline is in the "OFF" state.

24. The integrated assembly of claim 15 wherein the transistor is configured to couple the fourth end to the second end during the transition of the second wordline from an "ON" state to an "OFF" state, and while the first wordline is in the "OFF" state.

25. The integrated assembly of claim 15 wherein the transistor is a first transistor and is configured to couple the second end to the LOW-VOLTAGE-REFERENCE-SOURCE, and further comprising a second transistor between the second end and the fourth end, and configured to couple the second end to the fourth end during the transition of the first wordline from an "ON" state to an "OFF" state, and while the second wordline is in the "OFF" state.

26. The integrated assembly of claim 15 wherein the transistor is a first transistor and is configured to couple the fourth end to the LOW-VOLTAGE-REFERENCE-SOURCE, and further comprising a second transistor between the fourth end and the second end, and configured to couple the fourth end to the second end during the transition of the second wordline from an "ON" state to an "OFF" state, and while the first wordline is in the "OFF" state.

* * * * *